(12) United States Patent
Ficke et al.

(10) Patent No.: US 8,917,126 B1
(45) Date of Patent: Dec. 23, 2014

(54) CHARGE PUMP OPERATING VOLTAGE RANGE CONTROL USING DYNAMIC BIASING

(71) Applicant: International Business Machines Corporation, Armonk, NY (US)

(72) Inventors: Joel T. Ficke, Bloomer, WI (US); David M. Friend, Rochester, MN (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/138,981

(22) Filed: Dec. 23, 2013

(51) Int. Cl.
*H03L 7/06* (2006.01)
*H02M 3/07* (2006.01)

(52) U.S. Cl.
CPC ......................................... *H02M 3/07* (2013.01)
USPC .......................................................... 327/157

(58) Field of Classification Search
CPC ........ H03L 7/085; H03L 7/089; H03L 7/0891
USPC .................................. 327/147, 148, 156, 157
See application file for complete search history.

(56) References Cited

U.S. PATENT DOCUMENTS

| | | | |
|---|---|---|---|
| 4,771,249 A | 9/1988 | Burch et al. | |
| 5,144,156 A * | 9/1992 | Kawasaki | 327/157 |
| 6,057,739 A | 5/2000 | Crowley et al. | |
| 6,154,096 A | 11/2000 | Chien | |
| 6,747,497 B2 | 6/2004 | Ingino, Jr. | |
| 7,256,631 B2 * | 8/2007 | Kim | 327/157 |
| 7,888,990 B1 | 2/2011 | Bazes | |
| 8,183,913 B2 * | 5/2012 | Swei et al. | 327/537 |
| 8,294,497 B2 * | 10/2012 | Jeffries et al. | 327/157 |
| 8,487,677 B1 * | 7/2013 | Xue | 327/157 |
| 8,581,646 B2 * | 11/2013 | Fan | 327/157 |
| 8,749,284 B2 * | 6/2014 | Hsu | 327/157 |

OTHER PUBLICATIONS

Cai et al., "An improved Phase/Frequency Detector and a glitch-suppression Charge Pump design for PLL Applications," 10th IEEE International Conference on Solid-State and Integrated Circuit Technology, Nov. 2010, pp. 773-775, Shanghai, CN, © 2010 IEEE. D.O.I. 10.1109/ICSICT.2010.5667415.

Zhao et al., "A CMOS PLL Using Current-Adjustable Charge-Pump and On-Chip Loop Filter with Initialization Circuit," 5th International Conference on ASIC, Oct. 2003, pp. 728-731, vol. 2, © 2003 IEEE. D.O.I. 10.1109/ICASIC.2003.1277314.

* cited by examiner

*Primary Examiner* — Jeffrey Zweizig
(74) *Attorney, Agent, or Firm* — Robert R. Williams

(57) ABSTRACT

A system is disclosed, which may include a differential charge pump. The differential charge pump may include a first and a second H-bridge circuit, each driving, on a respective output, an output current that is substantially similar over an output voltage operating range. The differential charge pump may be designed to receive increment, decrement and bias signals, and drive, in response to the increment and decrement signals, the output current to draw each H-bridge circuit output towards a first or a second supply voltage. The differential charge pump may also be designed to increase, in response to the bias signals, the output voltage operating range over which the output current is substantially similar. The differential charge pump may also include a bias signal generator, designed to generate bias signals in response to H-bridge circuit output voltages.

16 Claims, 7 Drawing Sheets

CHARGE PUMP OPERATING VOLTAGE RANGE CONTROL USING DYNAMIC BIASING

TECHNICAL FIELD

The present disclosure relates to charge pump circuits. In particular, this disclosure relates to expanding a charge pump operating voltage range.

BACKGROUND

In a computer or other electronic system, clock signals may be used to control and sequence the flow of data between sequential storage elements, such as registers or latches on an integrated circuit (IC). A clock circuit including a phase-locked loop may be useful to maintain precise phase relationships between a reference clock signal and a distributed clock signal that is used to sequence digital logic or other circuit elements. Precise clock phase relationships may be useful in achieving known and efficient timing relationships between sequential logic elements.

A phase-locked loop circuit may detect phase differences between a reference clock signal and a distributed clock signal, and generate control signals based on those phase differences. The control signals may be used to adjust the timing and/or frequency of a clock generation circuit such as a voltage-controlled oscillator (VCO), or a delay-locked loop (DLL), the output of which may be distributed to a plurality of logic or other circuit elements.

SUMMARY

Various aspects of the present disclosure may be useful for providing a charge pump output current that is substantially similar over a wide charge pump output voltage operating range. A clock distribution system configured according to embodiments of the present disclosure may have a robust and proportional response to a broad range of phase and frequency differences between a reference clock input and a feedback clock input.

Embodiments may be directed towards a system. The system may include a differential charge pump having a first and a second H-bridge circuit, each driving, on a respective output, an output current that is substantially similar over an output voltage operating range between a first supply voltage and a second supply voltage. The H-bridge circuits may be designed to receive increment, decrement and bias signals, and drive, in response to the increment and decrement signals, the output current to draw each respective and corresponding H-bridge circuit output towards one of a first and a second supply voltage. The H-bridge circuits may also be designed to increase, in response to the bias signals, the output voltage operating range over which the output current is substantially similar. The differential charge pump may also include a bias signal generator. The bias signal generator may be designed to generate the bias signals, in response to a respective and corresponding H-bridge circuit output voltage being within a voltage range between a first and a second supply voltage.

Embodiments may also be directed towards an apparatus including an H-bridge circuit. The H-bridge circuit may include a field-effect transistor (FET). The FET may have a source terminal coupled to a supply voltage, a drain terminal coupled to an H-bridge circuit output, and a gate terminal coupled to a dynamic bias voltage. The H-bridge circuit may be designed to drive, in response to the dynamic bias voltage, and using the FET as a current source, a current on an H-bridge circuit output. The apparatus may also include a bias circuit. The bias circuit may be designed to be responsive to a drain-source voltage of the FET being less than an operational value by increasing the dynamic bias voltage. The bias circuit may also be designed to increase a gate-source voltage of the FET, as the charge pump output voltage approaches the supply voltage, to maintain a FET output current that is substantially similar over an output voltage operating range.

Embodiments may also be directed towards a method for increasing an output voltage operating range of a charge pump when an output of an H-bridge circuit within the charge pump is within a voltage range of a first or a second supply voltage. The method may include generating bias signals in response to an H-bridge circuit output voltage, receiving, from a phase-frequency detector, increment and decrement signals, and driving, in response to the increment and decrement signals, an H-bridge circuit output towards a first or a second supply voltage. The method may also include monitoring an H-bridge circuit output voltage, comparing the H-bridge circuit output voltage to a voltage threshold, and determining if the H-bridge circuit output voltage exceeds the voltage threshold. The method may also include adjusting the bias signals, in response to the determining, and increasing, in response to the bias signals, the H-bridge circuit output voltage operating range of the charge pump output.

Aspects of the various embodiments may be used to enhance clock system performance by providing a broad operating range for a charge pump and PLL within the clock system. Aspects of the various embodiments may also be useful for providing cost-effective clock system enhancements, by using existing and proven IC technologies.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes

DETAILED DESCRIPTION

Certain embodiments of the present disclosure can be appreciated in the context of a charge pump circuit that may be used for driving the differential inputs of a phase-locked loop (PLL), within a clock distribution system, with a substantially similar current over a broad PLL input voltage range. Such clock distribution systems may include, but are not limited to, systems designed to distribute digital clock signals within computers, other types of electronic systems, and integrated circuits (ICs). While not necessarily limited thereto, embodiments discussed in this context can facilitate an understanding of various aspects of the disclosure. Certain embodiments may also be directed towards other equipment and associated applications, such as a clock distribution system including delay locked loops (DLLs) for use with, or inclusion within, computers, other types of electronic systems, and integrated circuits (ICs). Such ICs may include, but are not limited to digital circuits fabricated in various semiconductor technologies. Embodiments may also be directed towards clock distribution systems for other types of systems that include analog circuits, such as radio frequency (RF) and microwave systems.

Various embodiments of the present disclosure relate to charge pump bias generator circuits configured to sense the voltage on the outputs of a charge pump and respond by varying bias voltages, which can be useful for providing a charge pump connected to the bias generator circuit with a feedback loop that may control charge pump output current levels. A charge pump output having substantially similar current over a broad output voltage range may result from the use of the charge pump bias generator circuit. The charge pump circuit may be designed to dynamically respond to charge pump bias generator feedback, and may be configured to mitigate reduced output current drive resulting from a low drain-source voltage on a current-sourcing FET, to provide a VCO response proportional to a broad range of charge pump output voltages.

A charge pump and charge pump bias signal generator designed according to certain embodiments may be compatible with existing and proven IC technologies and clock distribution systems, and may be a useful and cost-effective way to provide robust clock distribution system performance and responsiveness over a broad range of operating conditions.

Figure 1:
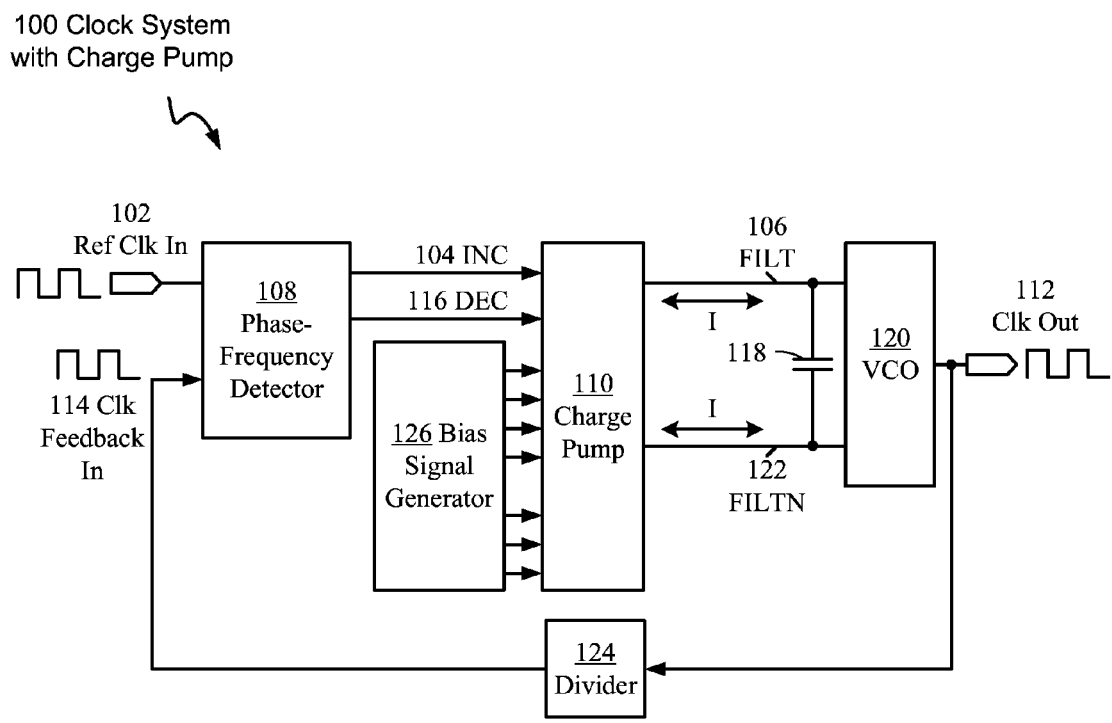
FIG. 1 is a block diagram illustrating a charge pump application, according to embodiments of the present disclosure.

Certain embodiments relate to clock systems including charge pumps configured to dynamically respond to bias signal inputs. FIG. 1 is a block diagram depicting clock system 100, which may be a phase-locked loop (PLL) generally used for clock phase and frequency control in a clock distribution system, within an integrated circuit (IC), or other electronic device or system, according to embodiments of the present disclosure. The clock system 100 may receive a reference clock input 102 from a source such as a frequency generator, and produce a clock output 112, which may drive a clock distribution network within an IC. The clock output signal 112 may also be divided (reduced in frequency) by divider 124 and fed back to the system through clock feedback input 114, where it may be monitored and compared to the reference clock input 112. The clock system 100 may adjust the phase and frequency of clock output 112, in response to phase and frequency differences between clock input 102 and clock feedback input 114. The clock system 100 may be useful in maintaining controlled phase and frequency relationships between clock output 112 and reference clock input 102.

Phase-frequency detector (PFD) 108 may be designed to receive reference clock input 102 and feedback clock input 114, and, in response to phase differences between the clock signals 102, 114, generate increment signal INC 104 and decrement signal DEC 116. INC 104 and DEC 116 may be, for example, pulses with duration proportional to a time difference between similar edges of clock signals 102 and 114.

Differential charge pump 110 may be designed to respond to INC 104 and DEC 116 by driving current onto the FILT 106 and FILTN 122 nodes, which may be used to increase or decrease the voltage across (charge or discharge) capacitor 118. Charge pump 110 may increase or decrease the voltage of capacitor 118 by driving complimentary (opposite) currents on the FILT 106 and FILTN 122 nodes. For example, when charge pump 110 is increasing the capacitor's 118 voltage, the direction of current on the FILT 106 node may be towards the capacitor 118, and the direction of current on the FILTN 122 node may be away from the capacitor 118. Similarly, when charge pump 110 is decreasing the voltage on capacitor 118, the direction of current on the FILT 106 node may be away from the capacitor 118, and the direction of current on the FILTN 122 node may be towards the capacitor 118. Charge pump 110 may include circuit topologies such as an H-bridge circuit, which may be useful for driving currents in a bidirectional manner on differential output nodes.

The VCO 120 may sense a voltage differential present between FILT 106 and FILTN 122, and produce a clock output 112 having a frequency proportional to the voltage differential. The VCO 120 may require a substantially uniform (and possibly a minimum) amount of current at a particular differential voltage level, to produce a signal having an output frequency proportional to an input voltage. If a required amount of current is not provided through the FILT 106 and FILTN 122 nodes, the output frequency of VCO 120 may not be maintained in a proportional relationship to the differential input voltage.

Capacitor 118 may be useful as a loop filter, to average and smooth the voltage resulting from current pulses generated by charge pump 110. A capacitor or other type of loop filter connected between the inputs of the VCO 120 may enable the VCO 120 to produce a clock with an output frequency, phase and other characteristics that are substantially unaffected by high-frequency current or voltage transients from charge pump 110. Other embodiments of a loop filter may include a resistor in series with a capacitor, a series-coupled resistor/capacitor in parallel with another capacitor, or other type of network.

A bias signal generator 126 may be useful in providing bias voltage inputs to charge pump 110, in order to control the amount of current that charge pump 110 drives on output nodes 106, 122. A bias signal generator 126 may produce static bias signals, each having a fixed voltage. Current-sourcing devices, such as field effect transistors (FETs) that may be used to drive charge pump 110 outputs, may experience a decrease in current sourcing ability when the charge pump output voltages approach a supply voltage, such as VDD or ground.

Figure 7:
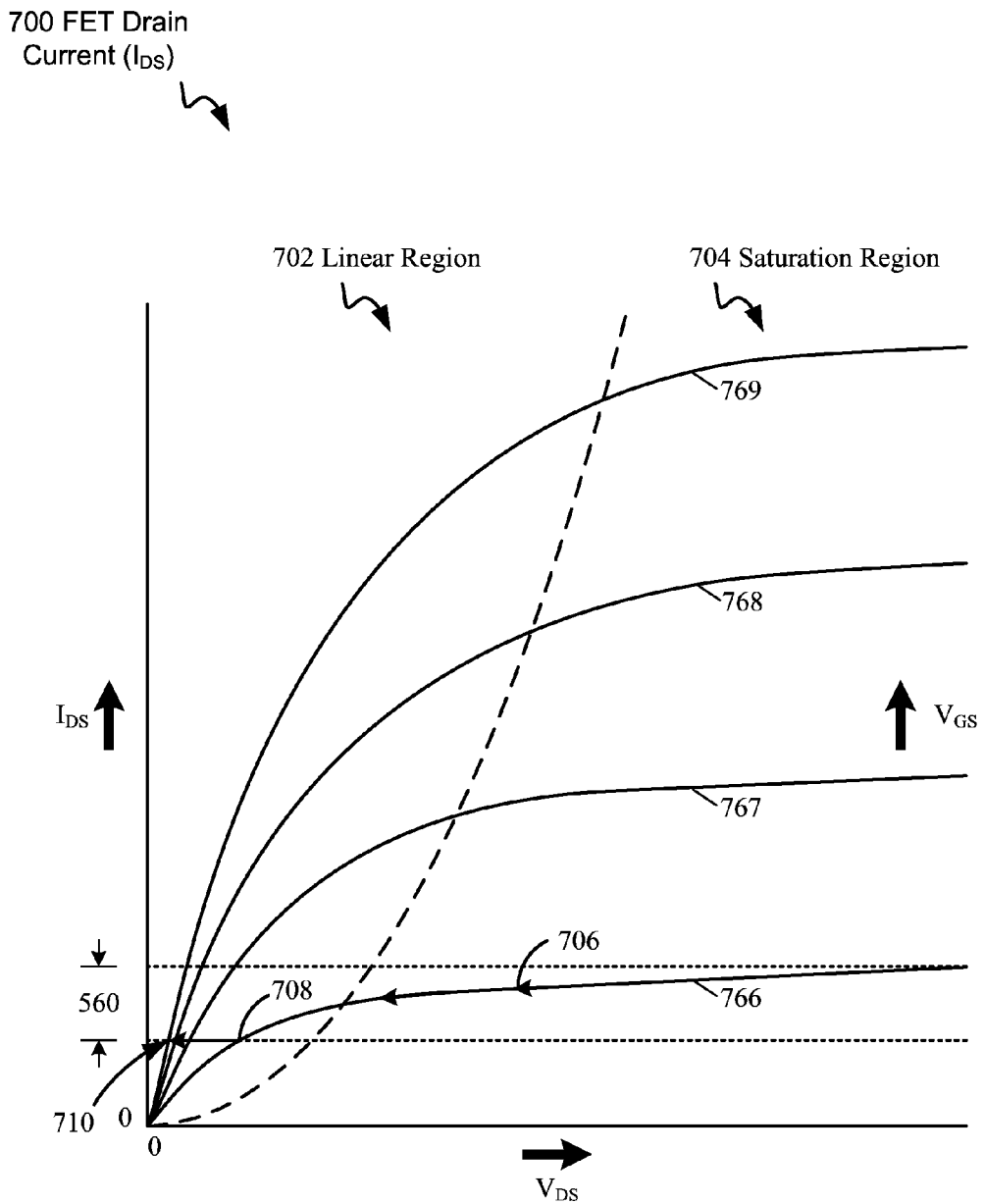
FIG. 7 is a graph depicting FET drain-source current ($I_{DS}$) as a function of FET gate-source voltage ($V_{GS}$) and FET drain-source voltage ($V_{DS}$), according to embodiments.

FIG. 7 illustrates a possible cause of a decrease in current sourcing ability when the charge pump output voltages approach a supply voltage, such as VDD or ground. FIG. 7 depicts a set of FET drain current curves 700, having a linear region 702 and a saturation region 704. Current profile 766 may represent available current at a given gate-source voltage. As the drain-source voltage ($V_{DS}$) corresponding to current profile 766 decreases, the drain-source ($I_{DS}$) current gradually decreases towards the lower limit of the current range 560. Current range 560 may depicts a charge pump output current range that is substantially similar to a specified or maximum output current value. Current value 706 may be within the current range 560. As the drain-source voltage ($V_{DS}$) continues to decrease, the current value 708, corresponding to a lower bound of current range 560, may be reached. A corresponding increase in gate-source voltage ($V_{GS}$) (transitioning to current profile 767, 768, and 769, in sequence) may allow increased drain-source ($I_{DS}$) current flow, as indicated by current point 710.

Current profile 568 (FIG. 5) illustrates the output current of a charge pump 110 controlled by static bias signals. The current remains substantially similar over the center portion of the current profile 568 (FIG. 5), but decreases rapidly as the output voltage (106A, graph 500) approaches either ground or VDD. The reduced output current supplied to the VCO 120 in these regions may result in a VCO output frequency that is not proportional to the differential input voltage. A VCO output 112 frequency that is not proportional to a VCO differential input voltage may result in the inability of clock system 100 to adjust the output 112 of VCO 120 to remain within a controlled phase/frequency relationship with reference clock input 102. A controlled phase/frequency relationship between a reference clock input and an output clock may be useful in maintaining functional system timing within an IC or other electronic system.

Figure 5:
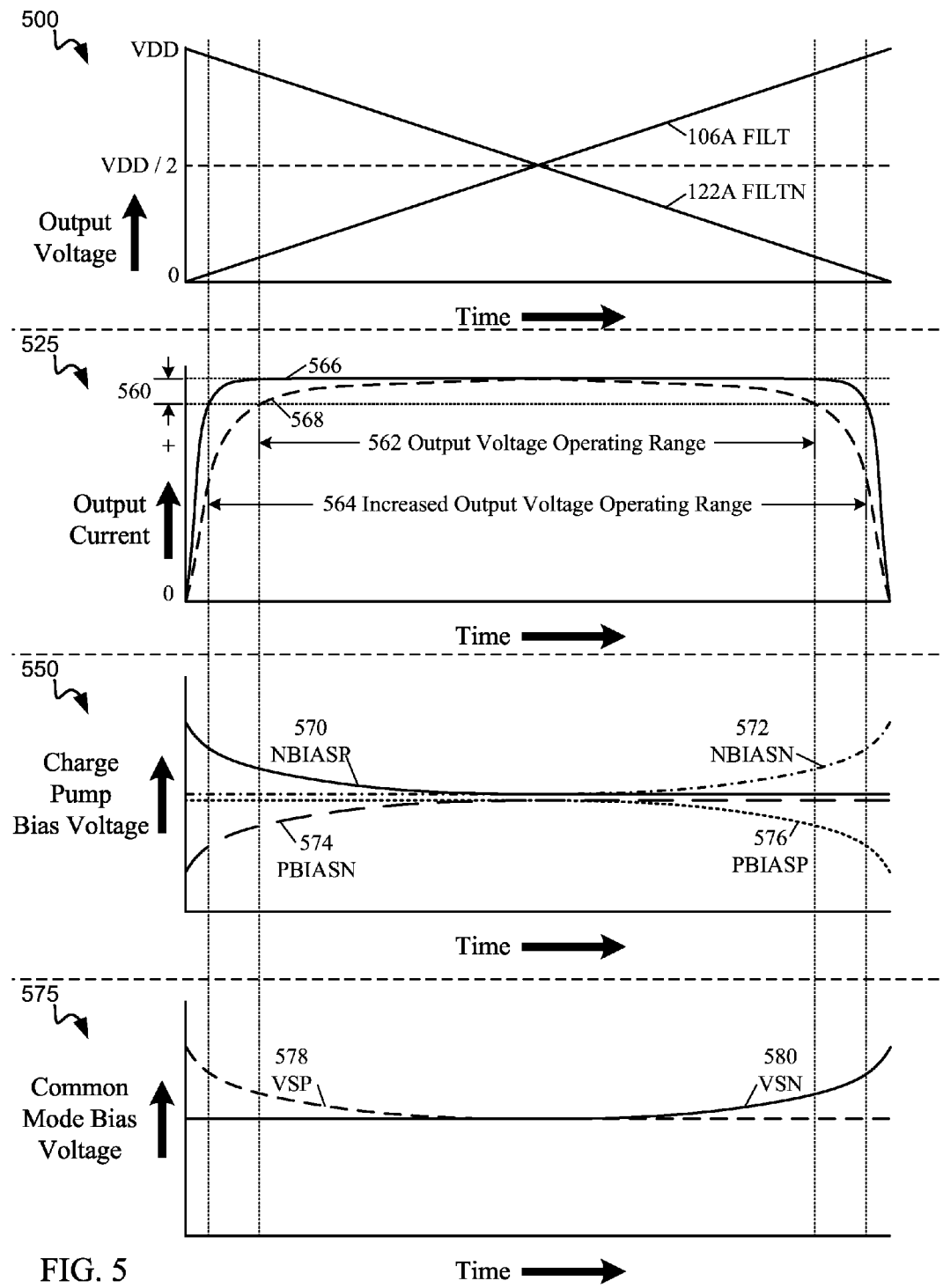
FIG. 5 includes 4 graphs depicting charge pump output voltages, output currents, bias voltages and common mode bias voltages plotted vs. time, according to embodiments.

In embodiments, a bias signal generator 126 may produce dynamic bias signals, having voltages that are varied in response to sensed charge pump 110 output voltage levels, such as 106A, 122A (FIG. 5). Dynamic bias signals may be increased or decreased, relative to static bias voltage levels, by a bias signal generator 126, and may result in current-sourcing devices (such as FETs) driving an increased amount of current (relative to current driven in response to static bias signals) as a charge pump output voltage approaches a supply voltage. A dynamic bias signal generator 126 may be useful, in conjunction with charge pump 110 designed to respond to dynamic bias voltage signals, by increasing the charge pump output voltage range over which the VCO can operate while varying its output signal frequency in proportion to the differential voltage on its inputs.

VCO 120 may be designed to respond to a differential input voltage by producing a clock output signal 112 with a frequency that is higher than the frequency of reference clock input 102. For example, clock system 100 may be designed to receive a reference clock input 102 frequency of 1 GHz, and produce a clock output 112 with a frequency of 2 GHz. Frequency multiplication, as described, may be useful in producing (high) clock frequencies for logic within an IC, while using a reference clock input 102 with a significantly lower frequency. When the frequency of clock output 112 is a multiple of the frequency of reference clock input 102, a divider circuit 124 may be useful in producing a feedback clock signal (114) having a frequency equivalent to that of reference clock input 102. In some embodiments, clock system 100 may be a delay-locked loop (DLL) and include a delay line in place of VCO 120.

Clock system 100 may be useful as a closed loop feedback system (PLL or DLL) that may maintain a fixed phase/frequency relationship between a reference clock input 102 and a clock output 112, and may be used to provide clock signals with controlled phase and frequency for devices such as an IC. A dynamic bias signal generator 126 may be particularly useful within the clock system 100 by maintaining controlled phase and frequency relationships between a reference clock input and a clock output, over a wide range of charge pump output voltages.

Figure 2:
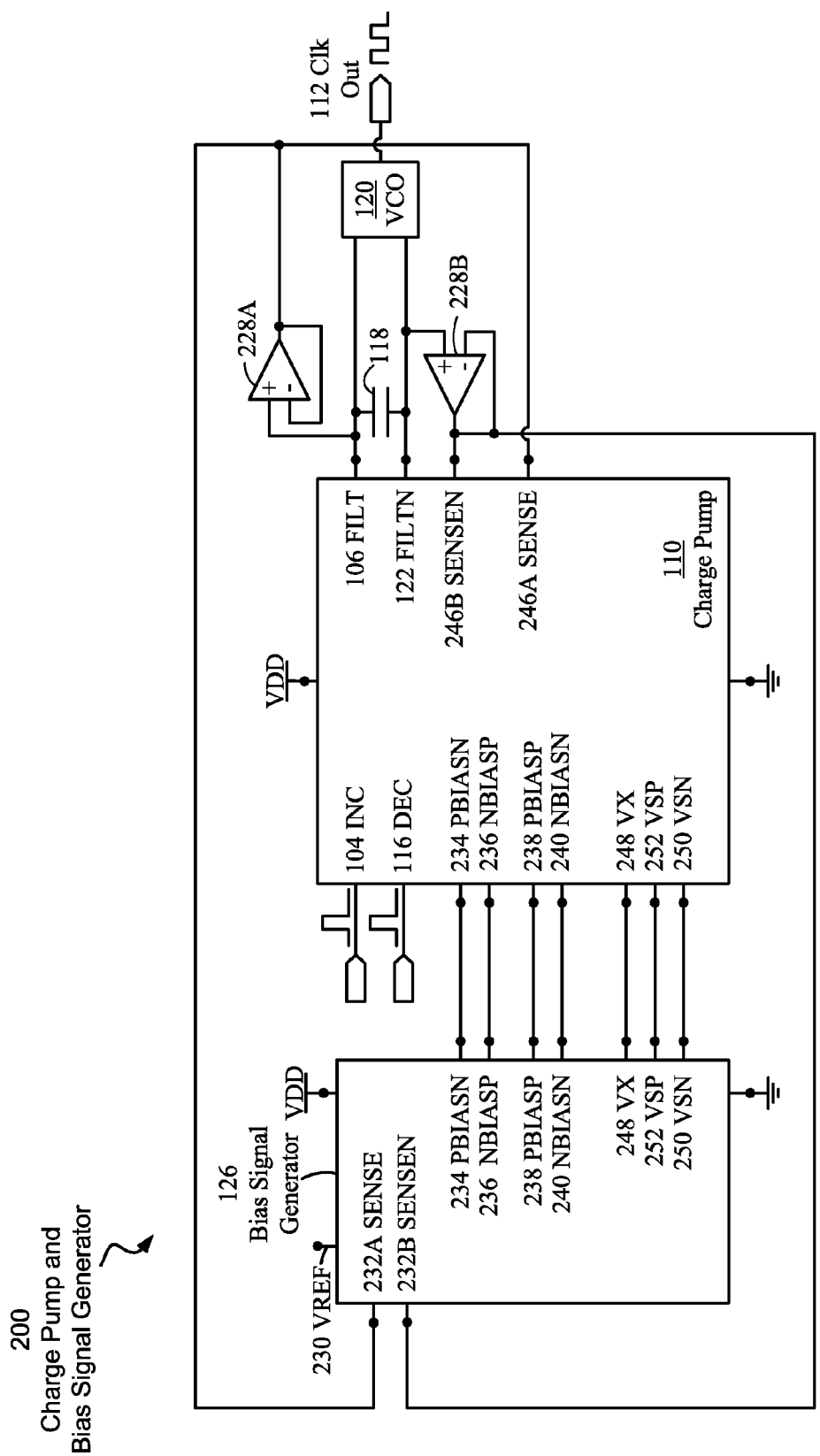
FIG. 2 is a block diagram representation of a charge pump and a bias signal generator, including two amplifiers, a voltage-controlled oscillator (VCO) and a capacitor, according to embodiments.

FIG. 2 is a block diagram representation of a charge pump 110 and a bias signal generator 126, including a first and a second amplifier, 228A, 228B, respectively, a voltage-controlled oscillator (VCO) 120 and a capacitor 118, according to embodiments consistent with FIG. 1. FIG. 2 illustrates the feedback and bias signal connections between charge pump 110 and bias signal generator 126.

The feedback signals SENSE 266A and SENSEN 246B may be useful in providing bias signal generator 126 with voltages corresponding to the FILT 106 and FILTN 122 output nodes. Bias signal generator 126 may generate bias signal voltages that may change in response to the value of the SENSE 266A and SENSEN 246B signals. Dynamic bias signals may be useful by increasing available current for output driving devices within charge pump 110, in response to charge pump output voltages approaching a supply voltage, such as VDD or ground. Unity gain amplifiers 228A and 228B may be configured to mirror the voltages of FILT 106 and FILTN 122 nodes onto the SENSE 266A and SENSEN 246B nodes, respectively.

Bias signal generator 126 may produce 2 groups of bias signals, which may be used to modify drive characteristics of current-sourcing devices within charge pump 110. A first group of bias signals including PBIASN 234, NBIASP 236, PBIASP 238 and NBIASN 240 may be used within charge pump 110 to control the amount of current available from current-source devices, such as FETs, for driving FILT 106 and FILTN 122 output nodes. Bias signal generator 126 may vary the voltage of these bias signals to increase the available output drive current (relative to a static bias signal) as the charge pump 110 output voltages approach a voltage supply. For example, voltage waveforms 570, 572, 574 and 576 (FIG. 5) illustrate possible bias voltage changes in response to FILT 106A and FILTN 122A output voltage changes. NBIASN 572, for example, may be connected to an N-channel field effect transistor (NFET) used as a current source to conduct current from the FILTN 122A node. As the voltage of the FILTN 122A node approaches ground (see 122A, FIG. 5), the NFET drain-source current may be reduced, and an increase in gate-source voltage, corresponding to the voltage of NBIASN 572, may increase the amount of current that the NFET may conduct under these conditions. Bias signals depicted by voltage waveforms 570, 574 and 576 (FIG. 5), may be similarly used to control output current available to charge or discharge FILT 106A and FILTN 122A nodes.

A second group of bias signals including VX 248, VSP 252 and VSN 250 may be used within charge pump 110 to center the charge pump common mode output voltages on the FILT 106A and FILTN 122A nodes between the VDD and ground supply voltages, and to maintain a proportional response of the charge pump circuit 110 to the first set of bias signals when the common mode voltages are adjusted (centered).

Bias signal generator 126 may vary the voltage of these bias signals to increase the available output drive current as the charge pump 110 output voltages approach a voltage supply. For example, voltage waveforms 578, 580 (FIG. 5) illustrate possible bias voltage changes in response to FILT 106A and FILTN 122A output voltage changes. VSN 580, for example, may be connected to and an N-channel field effect transistor (NFET) used to adjust a current ratio within a common mode feedback circuit within the charge pump 110.

Figure 3:
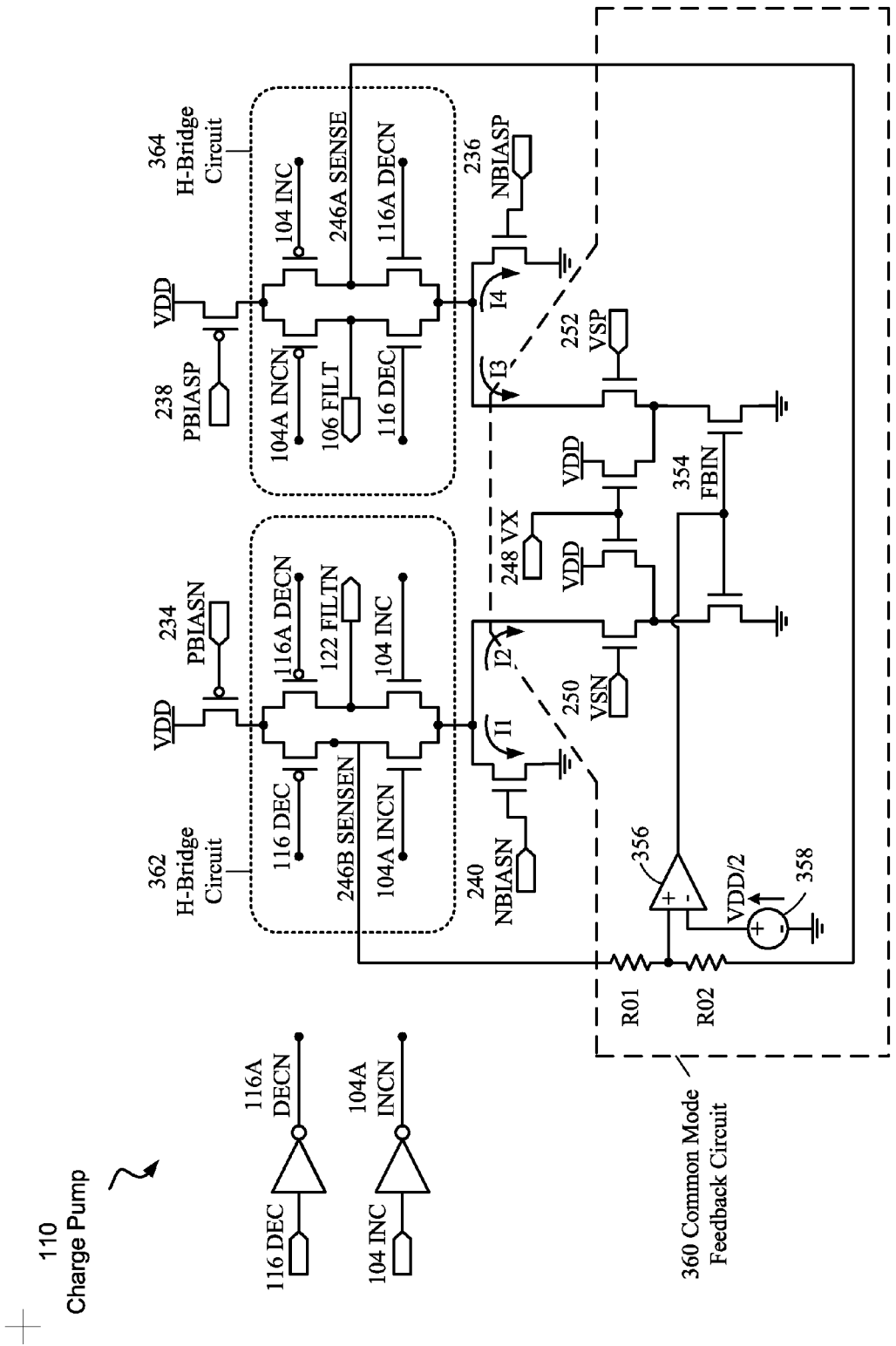
FIG. 3 is a schematic representation of a charge pump circuit, including two H-bridge circuits and a common mode feedback circuit, according to embodiments.

FIG. 3 is a schematic representation of a charge pump circuit 110, including two H-bridge circuits 362, 364 and a common mode feedback circuit 360, according to embodiments. Charge pump 110 may be useful for driving the FILT 106 and FILTN 122 outputs in response to the increment and decrement signals, INC 104 and DEC 116, respectively, and for responding to dynamic bias inputs provided by a bias signal generator, by driving increased current to the FILT 106 and FILTN 122 outputs in response to voltages on the outputs approaching VDD or ground supply voltages. Driving charge pump output nodes, in response to dynamic bias signals, with increased current (relative to the amount of current driven in response to static bias signals), may result in a PLL having a frequency response that is proportional to a wide range of charge pump output voltages. This proportional response may result in a clock system having an increased PLL operating range, and more robust performance and responsiveness to input voltage.

Increment and decrement signals INC 104 and DEC 116, respectively, may be received by the charge pump 110, inverted, and the signals INC 104 and DEC 116 and inverted copies (INCN 104A and DECN 116A, respectively) may be used to drive switching FETs within H-bridge circuits 362, 364. Switching FETs within the H-bridge may respond to increment and decrement signals by creating a current path between a current-sourcing FET that is connected to either VDD or ground, and one of the outputs FILT 106 and FILTN 122. For example, the NFET device connected to the INCN 104A signal in H-bridge circuit 364 may have a source terminal coupled to a supply voltage (VDD), a drain terminal coupled to H-bridge circuit 364 output FILT 106, and a gate terminal coupled to a dynamic bias voltage INCN 104A.

The switching FETs in the H-bridge circuits 364, 362 may be arranged to provide simultaneous connection of one H-bridge circuit output to VDD and the other H-bridge circuit output to ground, which may provide a differential voltage output to charge or discharge a capacitor or filter circuit attached to the charge pump. Switching FETs may include both PFET and NFET devices. Each H-bridge circuit may also connect to 2 current-source FETs, which may be used to supply a current path from the current sources (VDD or ground) to the H-bridge circuit. The current-source FETs may be controlled by the bias signals PBIASN 234, NBIASP 236, PBIASP 238, NBIASN 240, which may be used to increase the current drive capability of the FETs when a charge pump 110 output voltage approaches one of the supply voltages, or corresponds to a reduced current of a current-sourcing FET.

Common mode feedback circuit 360 may be designed to center differential H-bridge circuit output voltages, in a range between the first and the second supply voltage (ground and VDD, respectively). Resistors RO1 and RO2 may be connected to the outputs SENSE 246A and SENSEN 246B, and provide an average of the two voltages to an input of operational amplifier 356. Operational amplifier 356 may compare the (averaged) input voltage to a reference voltage, VR/2 (provided by voltage source 358), and may generate the signal FBIN 354 with a voltage proportional to the voltage differential at the operational amplifier inputs. The signal FBIN 354 may be used to control (increase or decrease) current flow through a pair of NFETs connected, respectively, between the lower side of each H-bridge circuit and ground, which may have the effect of centering (increasing or decreasing) the common mode voltage output of the H-bridge circuit outputs.

Common mode feedback circuit 360 may also include FETs connected to the bias signals VSN 250, and VSP 252. These FET devices may respond to the bias signals VSN 250, and VSP 252, to maintain a constant ratio of currents I1 and I2, and a similar ratio of currents I3 to I4. Maintaining these current ratios at a relatively constant value may ensure a uniform response of charge pump 110 to the bias signals PBIASN 234, NBIASP 236, PBIASP 238, NBIASN 240 over a range of common mode voltage adjustments (centering). FETs used in charge pump 110 may be either NFET or PFET types.

Figure 4:
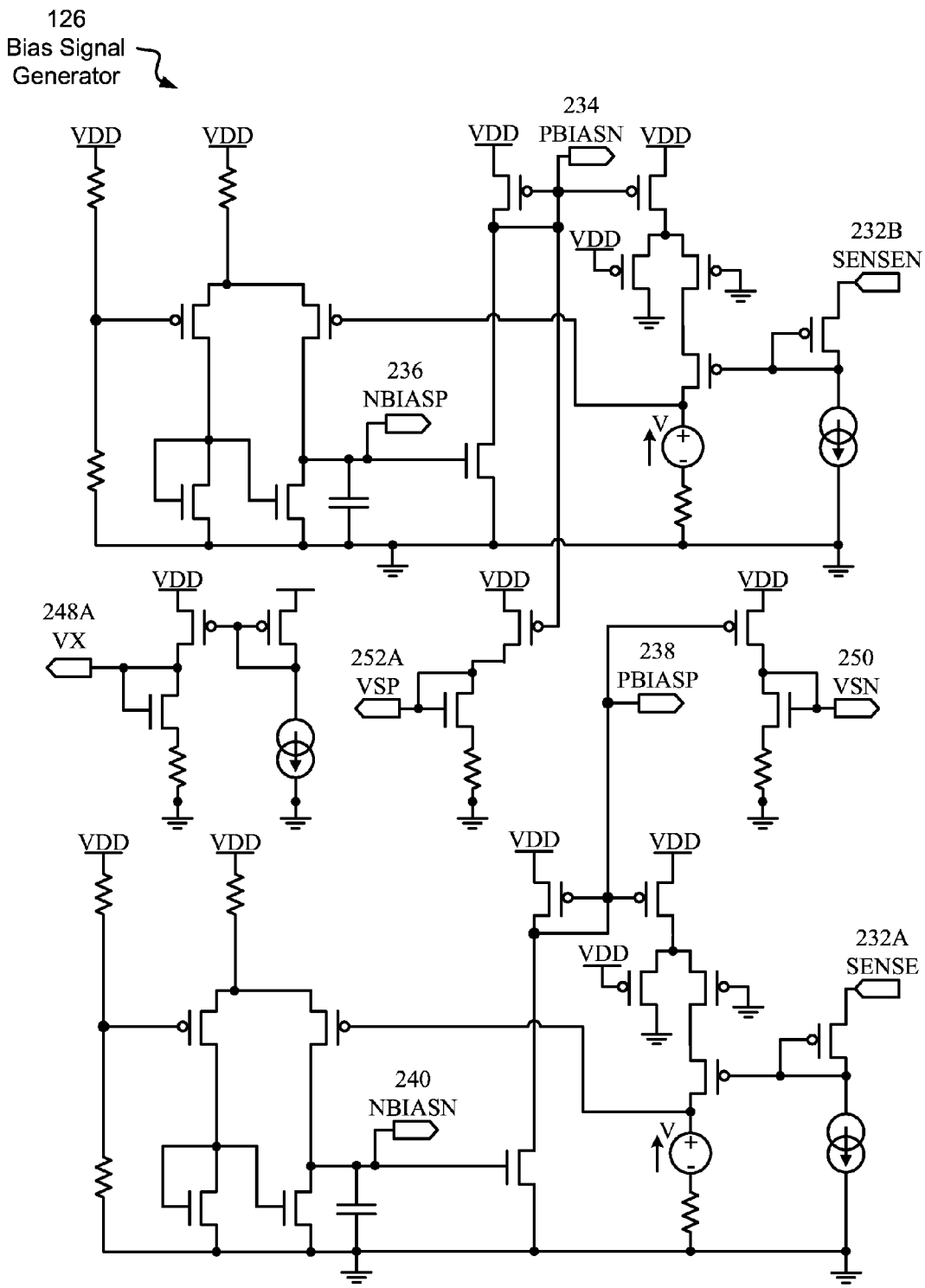
FIG. 4 is a schematic representation of a bias signal generator, including sense inputs and bias voltage outputs, according to embodiments.

FIG. 4 is a schematic representation of a bias signal generator 126, including inputs SENSE 232A, SENSEN 232B and bias voltage outputs PBIASN 234, NBIASP 236, PBIASP 238, NBIASN 240, according to embodiments. Bias circuit generator 126 may be generally used to generate bias signals in response to the SENSE 232A and SENSEN 232B inputs. The bias signal outputs may be connected to charge pump 110 to control the amount of current available to switching FETs within H-bridge circuits of 110, and to provide common mode output voltage centering.

Bias signal generator 126 may be designed to be responsive to a drain-source voltage of a FET within charge pump 110 (FIG. 3) being less than an operational value (in a linear region) by increasing the dynamic gate-source (bias) voltage of the FET to maintain a FET output (drain-source) current that is substantially similar over an output voltage operating range. Bias signal levels are further illustrated in FIG. 5. The bias signal generator 126 may include circuit topologies and devices such as current mirrors, voltage sources, current sources operational amplifiers and voltage dividers used to create signals that may experience a similar reduction in sourcing current as current-sourcing FETs coupled between a supply voltage and the H-bridge circuit output within charge pump 110. The bias signal generator 126 may use this effect to control bias signal voltage levels, which may be useful in mitigating the reduction of drive current within current-sourcing FETs in the charge pump 110. The characteristics of dynamic bias signals generated by the bias signal generator 126 are further illustrated and described in reference to FIG. 5.

FIG. 5 includes 4 graphs depicting charge pump output voltages (graph 500), charge pump output currents (graph 525), charge pump bias voltages (graph 550) and charge pump common mode bias voltages (graph 575) plotted vs. time, according to embodiments.

Graph 500 depicts the output voltages 106A, 122A corresponding to the FILT 106 and FILTN 122 outputs, respectively, of charge pump 110 (FIG. 3), with respect to time. The output voltages 106A, 122A may be differential (complementary); one may increase as the other decreases, and both may vary between the two supply voltage is VDD and ground. The voltages 106A, 122A represent voltages on a capacitor (e.g. 118, FIG. 2) or other loop filter connected between the FILT 106 and FILTN 122 outputs of the charge pump 110 (FIG. 2). The voltages may rise or fall in response to INC 104 and DEC 116 (FIG. 2) signals received by charge pump 110 (FIG. 3).

Graph 525 depicts positive output currents 566, 568 which may correspond to the current flowing on the FILT 106 (FIG. 3) node of charge pump 110 (FIG. 3) to a capacitor or loop filter connected to a VCO input, as voltages 106A, 122A increase and decrease, respectively (see graph 500). The current range 560 depicts a charge pump output current range that is substantially similar to a specified or maximum output current value. In one embodiment, a "substantially similar" current within 5% of a specified or maximum value may allow a VCO to produce an output signal frequency that is proportional to a differential input voltage. In some embodiments, a substantially similar current within 10% of a specified or maximum value may allow a VCO to produce an output signal frequency that remains proportional to a differential input voltage. The size of the "substantially similar" output current range of a charge pump may depend on the input impedance, current draw, and responses to input current and voltage levels by a particular VCO.

Output current 568 represents a positive current produced on the FILT 106 (FIG. 3) node of charge pump 110 (FIG. 3) in response to a series of pulses on the INC 104 input to the charge pump 110, while the charge pump 110 receives a set of static bias signals. The output voltage operating range 562 may be the intersection of the current profile 568 with the lower bound of current range 560. Output voltage operating range 562 may be a range of charge pump output voltages over which the output current is substantially similar to a maximum or specified current value.

Similarly, output current 566 represents a positive current produced on the FILT 106 (FIG. 3) node of charge pump 110 (FIG. 3) in response to a series of pulses on the INC 104 (FIG. 3) input to the charge pump 110, while the charge pump 110 receives a set of dynamic bias signals, according to embodiments of the present disclosure. The output voltage operating range 564 may be the intersection of the current profile 566 with the lower bound of current range 560. Output voltage operating range 564 may be a range of charge pump output voltages over which the output current is substantially similar to a maximum or specified current value. The difference between output voltage operating ranges 564 and 562 may illustrate the effect of using dynamic (varied in response to charge pump output voltages) bias signals in increasing an output voltage operating range of the charge pump and VCO, relative to an operating range resulting from using static bias signals.

Output current profiles 568, 566 represent positive output currents corresponding to a current used to increase charge on the FILT 106 (FIG. 3) node of charge pump 110 (FIG. 3). A corresponding negative output current may be used to draw charge from the FILTN 122 node of charge pump 110 (FIG. 3), and may be illustrated by current profiles similar to 568, 566, mirrored about the X-axis of graph 525.

Graph 550 depicts charge pump bias voltages NBIASP 570, NBIASN 572, PBIASN 574, and PBIASP 576, which may be generated by bias signal generator 126 (FIG. 4) in response to output voltages 106A, 122A (graph 500) and varied by bias signal generator 126 to increase the amount of current available to drive a charge pump 126 (FIG. 3) output. For example, PBIASP 576 may be decreased in response to FILT 106A increasing and approaching VDD, which corresponds to linear region for a PFET controlled by PBIASP 576 (FIG. 3), and used to source current from VDD to the FILT 106 node. Decreasing PBIASP 576 in this output voltage region may increase the current the PFET may supply to the FILT 106 node. Other depicted charge pump bias voltages may be increased or decreased in similar and corresponding voltage regions to mitigate a corresponding decrease in drive current due to the reduction of current sourcing ability of a FET.

Graph 575 depicts common mode bias voltages VSP 578 and the VSN 580, which may be generated by bias signal generator 126 (FIG. 4) in response to output voltages 106A, 122A (graph 500) and varied by bias signal generator 126 to control the ratio of currents I1 to I2, and I3 to I3, as depicted in FIG. 3. Maintaining control of these current ratios may allow charge pump 110 to maintain a linear response to the bias signals NBIASP 570, NBIASN 572, PBIASN 574, and PBIASP 576 over a range of common-mode voltage (centering) adjustments.

Figure 6:
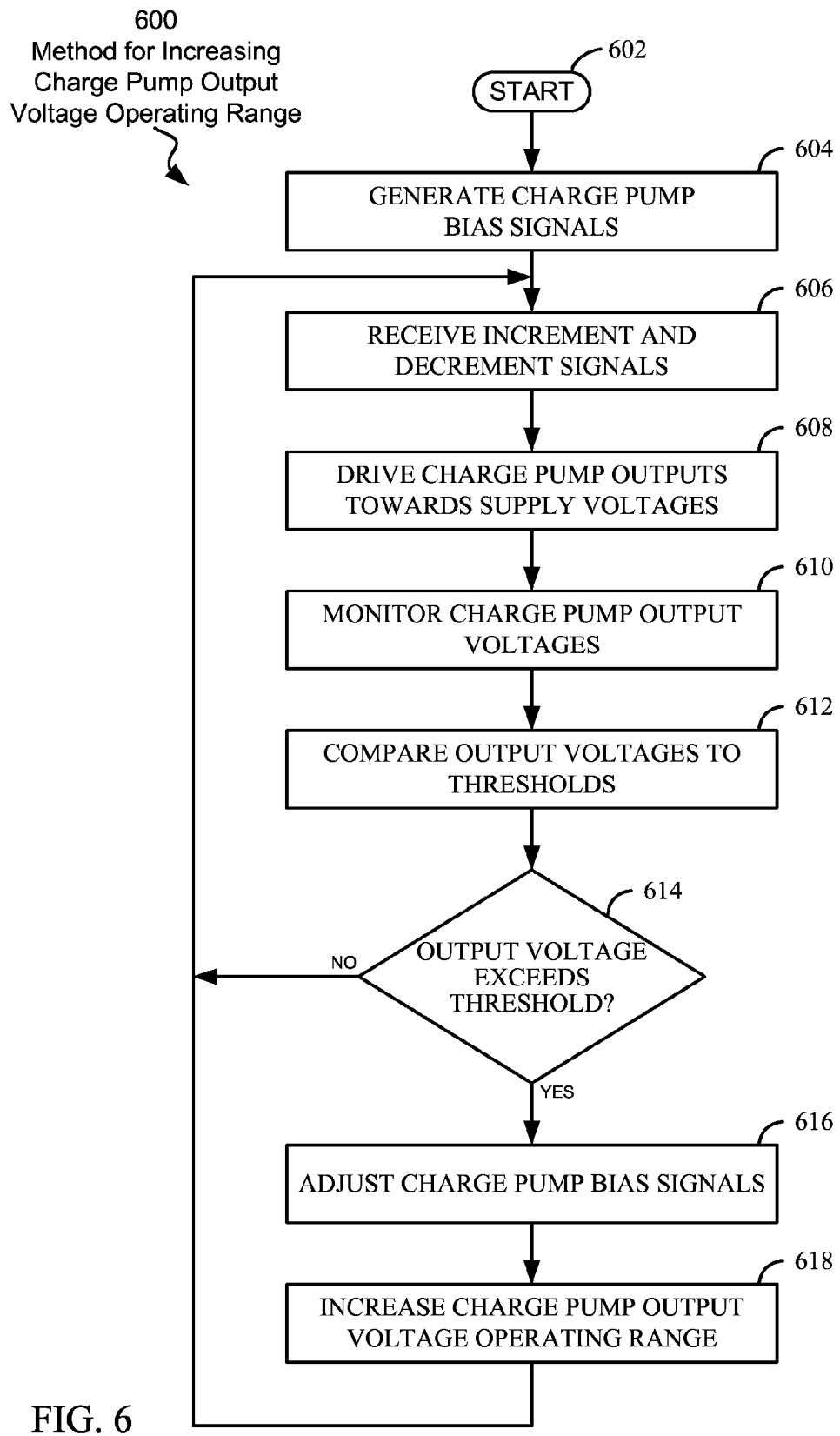
FIG. 6 is a flow diagram illustrating a method for increasing charge pump output voltage operating range, according to embodiments.

FIG. 6 is a flow diagram illustrating a method for increasing a charge pump output operating voltage range, according to embodiments. The process 600 moves from start 602 to operation 604. Operation 604 generally refers to generating charge pump bias signals, which may be done by a charge pump bias signal generator (126, FIG. 4). Charge pump bias signals may be generated in response to charge pump output voltages mirrored on SENSE 246A, SENSEN 246B nodes (FIG. 3). Once the charge pump bias signals have been generated, the process moves to operation 606.

Operation 606 generally refers to receiving increment and decrement signals. The charge pump (110, FIG. 1) may receive increment and decrement signals INC 104, and DEC 116, respectively (FIG. 1) from the phase-frequency detector (108, FIG. 1). Once the increment and decrement signals are received by the charge pump (110, FIG. 1), the process moves to operation 608.

Operation 608 generally refers to driving charge pump outputs towards supply voltages. The charge pump 110 (FIG. 3) may respond to the INC 104 (FIG. 3) and DEC 116 (FIG. 3) signals by creating current paths between a voltage source (VDD or ground) and each of the charge pump outputs FILT 106, FILTN 122 (FIG. 3), which may cause current flow, and charging or discharging of a capacitor 118 (FIG. 2) connected to the charge pump outputs. Once charge pump outputs are driven towards supply voltages, the process moves to operation 610.

Operation 610 generally refers to monitoring charge pump output voltages. Charge pump outputs SENSE 246A, SENSEN 246B (FIG. 3) are connected to the bias signal generator (126, FIG. 4), which monitors the charge pump output voltages. Once charge pump output voltages have been monitored, the process moves to operation 612.

Operation 612 generally refers to comparing charge pump (H-bridge circuit) output voltages to a known voltage threshold. The charge pump output voltages mirrored on SENSE 246A, SENSEN 246B (FIG. 3) nodes are compared to a known voltage threshold, which may be designed into circuitry within the bias signal generator (126, FIG. 4). The known voltage threshold may correspond to one or more linear regions of current-sourcing FETs that are coupled between an H-bridge circuit output and a supply voltage, within the charge pump 110 (FIG. 3), or to a specified voltage range adjacent to a supply voltage. Once charge pump output voltages have been compared to known voltage thresholds, the process moves to decision 614.

At decision 614, a determination is made based upon the results of the comparison of operation 612. If a charge pump output voltage exceeds the specified voltage threshold, then the process moves to operation 616. If charge pump output voltage does not exceed the specified voltage threshold, then the process returns to operation 606.

Operation 616 generally refers to adjusting charge pump bias signals. The bias signal generator (126, FIG. 4) may increase or decrease charge pump bias signals (such as 234, FIG. 2) corresponding to particular current-sourcing FETs within the charge pump, to increase the available output current. Once charge pump bias signals have been adjusted, the process moves to decision 618.

Operation 618 generally refers to increasing charge pump output voltage operating range. As a result of increasing the charge pump bias signals, to increase current driven from the charge pump outputs FILT 106, FILTN 122 (FIG. 3), an increased operating range (564, FIG. 5) may be realized. Operating range 564 corresponds to a charge pump output voltage operating range within which the amount of current driven from a charge pump output is substantially similar (560, FIG. 5). Once the charge pump output voltage operating range has been adjusted, the process returns to operation 606.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

What is claimed is:

1. A system comprising:
 a differential charge pump including:

a first and a second H-bridge circuit, each designed to drive, on a respective output, an output current that is substantially similar over an output voltage operating range that is between a first supply voltage and a second supply voltage, and designed to:
receive increment, decrement and bias signals;
drive, in response to the increment and decrement signals, the output current to draw each respective and corresponding H-bridge circuit output towards one of a first and a second supply voltage; and
increase, in response to the bias signals, the output voltage operating range over which the output current is substantially similar; and
a bias signal generator, designed to generate, in response to a respective and corresponding H-bridge circuit output voltages being within a voltage range that is between a first and a second supply voltage, the bias signals.

2. The system of claim 1, further comprising a first and a second amplifier, configured to transfer the H-bridge circuit output voltages to the bias signal generator.

3. The system of claim 1, further comprising a phase-frequency detector (PFD), designed to generate, in response to phase differences between a reference clock input and a feedback clock input, the increment and decrement signals.

4. The system of claim 1, further comprising a loop filter coupled to the H-bridge circuit outputs.

5. The system of claim 4, wherein the loop filter is a capacitor.

6. The system of claim 1, further comprising a voltage-controlled oscillator (VCO) having a clock output, and designed to, in response to voltage differences between the H-bridge circuit outputs, vary a frequency of the clock output.

7. The system of claim 1, wherein the charge pump further comprises a common mode feedback circuit designed to center a differential H-bridge circuit output voltage in a range between the first and the second supply voltage.

8. The system of claim 1, wherein an H-bridge circuit further comprises an N-channel field-effect transistor (NFET) coupled between the first supply voltage and the H-bridge circuit output, and designed to, in response to the bias signals, control an amount of current to the H-bridge circuit output.

9. The system of claim 1, wherein an H-bridge circuit further comprises a P-channel field-effect transistor (PFET) coupled between the second supply voltage and an H-bridge circuit output and designed to, in response to the bias signals, control an amount of current to the H-bridge circuit output.

10. The system of claim 1, wherein the bias signal generator comprises current minor circuits.

11. The system of claim 1, wherein the bias signal generator is designed to vary the bias signals corresponding to a linear voltage region of a field-effect transistor (FET) coupled between a supply voltage and the H-bridge circuit output.

12. An apparatus comprising:
an H-bridge circuit including:
a field-effect transistor (FET) having:
a source terminal coupled to a supply voltage;
a drain terminal coupled to an H-bridge circuit output; and
a gate terminal coupled to a dynamic bias voltage;
the H-bridge circuit designed to drive, in response to the dynamic bias voltage and using the FET as a current source, a current on an H-bridge circuit output; and
a bias circuit designed to:
increase the dynamic bias voltage in response to a drain-source voltage of the FET being less than an operational value;
increase a gate-source voltage of the FET to maintain a FET output current that is substantially similar over an output voltage operating range.

13. A method for increasing an output voltage operating range of a charge pump when an output of an H-bridge circuit within the charge pump is within a voltage range of one of a first and a second supply voltage, the method comprising:
generating, in response to an H-bridge circuit output voltage, bias signals;
receiving, from a phase-frequency detector, increment and decrement signals;
driving, in response to the increment and decrement signals, an H-bridge circuit output towards one of a first and a second supply voltage;
monitoring an H-bridge circuit output voltage;
comparing the H-bridge circuit output voltage to a voltage threshold;
determining if the H-bridge circuit output voltage exceeds the voltage threshold;
adjusting, in response to the determining, the bias signals; and
increasing, in response to the bias signals, the H-bridge circuit output voltage operating range of the charge pump output.

14. The method of claim 13, wherein the generating of the increment and decrement signals is performed by a phase-frequency detector.

15. The method of claim 13, wherein the generating of the bias signals is performed by a bias signal generator.

16. The method of claim 13, wherein the voltage range of one of a first and a second supply voltage for generating bias signals corresponds to a linear voltage region of a FET coupled between a supply voltage and the H-bridge circuit output.

* * * * *